United States Patent
Oggioni (10) Patent No.: US 7,070,085 B2
(45) Date of Patent: Jul. 4, 2006

(54) WATER SOLUBLE PROTECTIVE PASTE FOR MANUFACTURING PRINTED CIRCUIT BOARDS

(75) Inventor: Stefano Oggioni, Besana in Brianza (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,724

(22) Filed: Jan. 7, 2004

(65) Prior Publication Data

US 2005/0001017 A1 Jan. 6, 2005

(30) Foreign Application Priority Data

Jul. 1, 2003 (EA) .................. 03368002

(51) Int. Cl.
*B23K 31/02* (2006.01)
*B23K 1/20* (2006.01)
*B23K 35/34* (2006.01)

(52) U.S. Cl. ............. 228/207; 228/214; 228/223; 148/23

(58) Field of Classification Search ............ 228/207, 228/214, 223; 427/96.2, 430.1; 106/8, 14.18, 106/14.36, 156.51; 101/48; 148/22, 23
See application file for complete search history.

(56) References Cited

U.S. PATENT DOCUMENTS

| | | | |
|---|---|---|---|
| 2,798,053 A * | 7/1957 | Brown ................ 521/38 |
| 3,448,512 A * | 6/1969 | Saba ................ 228/211 |
| 3,461,073 A * | 8/1969 | Tinklenaugh et al. .. 252/182.32 |
| 3,730,782 A * | 5/1973 | Pollack et al. ............ 148/23 |
| 3,900,320 A * | 8/1975 | Rolker et al. ............ 430/324 |
| 5,825,628 A | 10/1998 | Garbelli et al. |
| 6,043,670 A * | 3/2000 | Degani et al. ............ 324/765 |
| 6,049,464 A | 4/2000 | Garbelli et al. |
| 6,115,911 A * | 9/2000 | Liaw ................ 29/840 |
| 6,266,251 B1 | 7/2001 | Bassi et al. |
| 6,472,079 B1 * | 10/2002 | Hayashi et al. ............ 428/447 |
| 6,617,698 B1 | 9/2003 | Buchwalter et al. |
| 6,639,304 B1 | 10/2003 | Oggioni et al. |
| 6,710,258 B1 | 3/2004 | Oggioni et al. |
| 6,717,255 B1 | 4/2004 | Oggioni et al. |
| 6,752,309 B1 * | 6/2004 | Parhar ................ 228/223 |
| 6,777,817 B1 | 8/2004 | Buchwalter et al. |
| 6,806,122 B1 | 10/2004 | Oggioni et al. |
| 6,842,657 B1 * | 1/2005 | Drzaic et al. ............ 700/120 |

(Continued)

FOREIGN PATENT DOCUMENTS

EP 0847084 A2 6/1998

(Continued)

*Primary Examiner*—Lynne R. Edmondson
(74) *Attorney, Agent, or Firm*—Joseph P. Abate (57) ABSTRACT

An improved water soluble protective paste and a method for protecting metal circuits and pads on the surface of an electronic board during the manufacturing steps. A densifier is added to the paste making it easier and more efficient the dispensing of the paste. After deposition the layer is dried until a solid protective film is obtained. An additional advantage obtained by the present invention is that the protective layer can be deposited also by means of an offset printing process, avoiding the use of the stencil and of the screening steps. Screening process is a labourious operation which requires very sophisticated equipment and a very high precision in the design of the stencil. Because of these requirements, screening is an expensive process. On the other hand offset printing is a very simple, cheap and reliable method. In addition, the film forming properties allow the material to create a protective film even with a thin deposited film.

23 Claims, 5 Drawing Sheets

U.S. PATENT DOCUMENTS

| | | |
|---|---|---|
| 2002/0055277 A1 | 5/2002 | Oggioni et al. |
| 2002/0171132 A1 | 11/2002 | Buchwalter et al. |
| 2002/0180004 A1 | 12/2002 | Oggioni et al. |
| 2003/0174478 A1 | 9/2003 | Oggioni et al. |
| 2004/0041280 A1 | 3/2004 | Buchwalter et al. |
| 2004/0069529 A1 | 4/2004 | Oggioni et al. |
| 2004/0150097 A1 | 8/2004 | Gaynes et al. |
| 2004/0234701 A1* | 11/2004 | Caton ................. 427/430.1 |
| 2004/0250919 A1* | 12/2004 | Saito et al. ................. 148/25 |

FOREIGN PATENT DOCUMENTS

| | | |
|---|---|---|
| EP | 0814511 A3 | 11/1998 |
| GB | 2354636 A | 3/2001 |
| JP | 06-032082 | 2/1994 |
| JP | 06-051521 | 2/1994 |
| JP | 06-18843 | 3/1994 |
| WO | WO 97/13275 | 4/1997 |
| WO | WO 03/043085 A3 | 5/2003 |
| WO | WO 2004/017687 A1 | 2/2004 |

* cited by examiner

WATER SOLUBLE PROTECTIVE PASTE FOR MANUFACTURING PRINTED CIRCUIT BOARDS

BACKGROUND OF THE INVENTION

DETAILED DESCRIPTION

The present invention relates to a protective paste for the manufacturing of electronic modules with particular attention to the manufacturing of Hybrid Multi Chip Modules.

Figure 1:
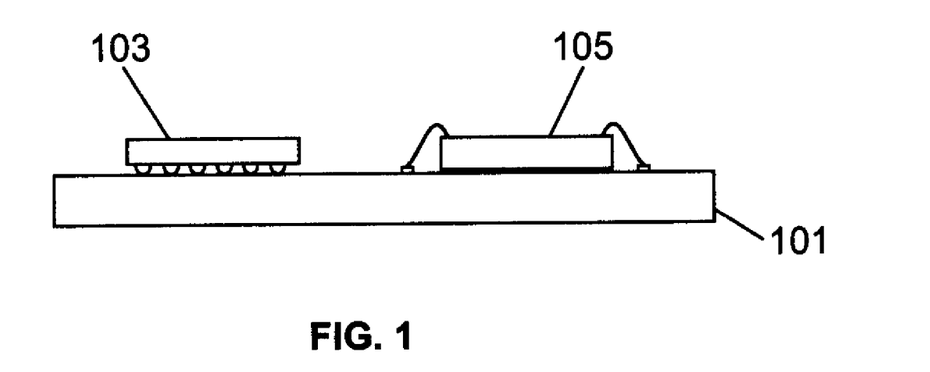
FIG. 1 is a schematic representation of a Hybrid Multi Chip Module (HMCM)

Hybrid organic laminate chip package or Hybrid Multi Chip Module (HMCM) is more and more used in electronics due to its small dimensions and high performance. A hybrid package, as shown in FIG. 1 has a substrate 101 on which at least one Surface Mount Technology (SMT) component 103 and at least one wire bonded chip 105 are mounted together.

SMT is a well known technique for electronic card assembly.

SMT usually consists of the following main steps:—

Screening of solder paste on the pads of the Printed Circuit Board (PCB). The paste screening is done by means of a stencil which is laid on the substrate and a squeegee (usual a rubber blade) which spread the solder paste on the required spots;— Placement of components on the paste. This operation is performed with dedicated machines, having different speeds and precision according to the component dimension and weight.

Reflow of the solder paste under air or nitrogen, depending on the paste flux. Very active fluxes, that protect the powder alloy from the oxidation, allow an air atmosphere to be used. Normally, this reflow operation is performed at high temperature in the range 200° C.–240° C.

The usual wire bonded chip assembly process comprises substantially the following steps:— Die attaching of the chip to the substrate with thermal adhesive dispensing and curing (i.e. polymerisation). The curing process is usually performed at 150° C. for 3–5 hours.

First and second bonding of the two wire ends respectively to the aluminium pad on the chip (also known as ball bonding operation) and to the gold pad on the substrate (also known as wedge bonding operation). This operation comprises connecting the wire and the pad with the application of a compression force and ultrasonic energy by a vibrating probe.

The bonding operations cause the mutual diffusion of the two metals into each other (gold-gold and gold-aluminium). This diffusion is due to the movement of the surface layer atoms, and it depends strongly on the cleanliness of the surface. In fact the surface contamination of the gold and aluminium pads (i.e. the presence of atoms not belonging to the metal lattice) behaves like a barrier against the atom movement, decreasing or totally preventing the wire bonding. For this reason the metal pads need to be completely clean for good bonding with the wires.

Figure 2:
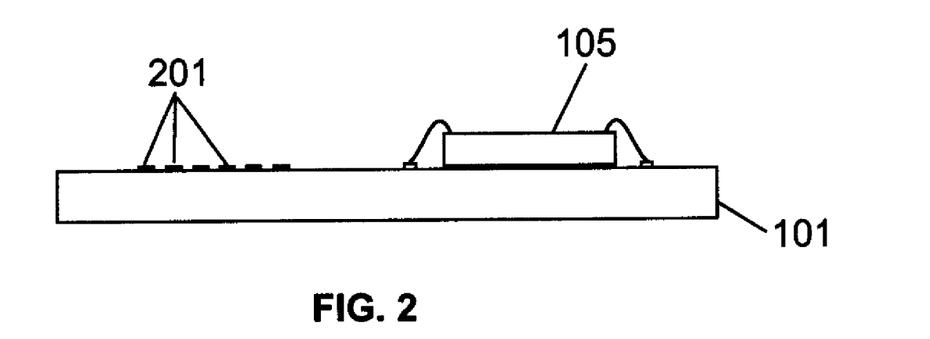
FIG. 2 is a schematic representation of a step of the HMCM manufacturing process when only the wire bonded chip is attached.

In a HMCM, where both SMT and wire bonded chip attach processes must be performed, it is usual to do the wire bonded chip attach first, followed by the SMT. As shown in FIG. 2, the presence of the wire bonded chip 105 on the substrate 101 when the SMT process starts, prevents the solder paste being dispensed by screening and an alternative paste dispensing method is needed. This is because the stencil cannot be properly laid on the substrate and the squeegee cannot run on the stencil to dispense the paste on the pads 201. A known alternative dispensing method is the point by point dispensing by means of a syringe, which is a much more expensive process than the screening method. On the other hand the inversion of SMT and wire bonded chip attachment processes would cause problems due to the contamination of the gold pads during the SMT process. This contamination is mainly due to the following factors:— solder paste spreading during the solder paste screening;— solder splattering from SMT components during the solder paste reflow;— organic and tin/lead vapours produced during the solder paste reflow and depositing on the substrate.

Solder splattering, in particular, is a thick and very dangerous contamination, that compromises the gold pads bondability. This unwanted contamination is very difficult to be removed and needs very expensive treatment, e.g. plasma cleaning. Plasma cleaning is a powerful technique applied in several industrial fields, such as mechanics, electroncs, optics. Plasma, also called 'fourth state of matter', is produced by applying an energy field to a gas, causing its ionization. The electron and the ions, accelerated by the energetic field, achieve a kinetic energy that can be transferred to the surface of an object that has to be cleaned and, if it is higher than the cohesion force of the surface atoms of the object, the plasma is able to remove them. However it could happen that for cleaning off a hard organic film (like flux residues of the solder paste) it needs to achieve a plasma kinetic energy so high that it overcomes the sputtering threshold of the other materials present on HMCM, so that they are damaged.

U.S. patent application Ser. No. 09/666,949 of the same Applicant discloses a protective paste for protecting metal circuits during the manufacture of electronic modules comprising a citrate salt dissolved in water and glycerol. The paste is used in the manufacturing process, mitigating the problem of gold contamination during the SMT assembly operations. This result is obtained by protecting, at the first process step, the gold with a thin layer (0.01–0.04 millimetre) of a paste very soluble in water and washing it off. The advantages of this paste are the absence of residues on the surface after washing and the reduced thickness, which facilitates the screening of the paste, compared to the protective pastes previously available.

The paste disclosed in U.S. patent application Ser. No. 09/666,949 is a gel, which is suitable for screen printing, however its rheological properties could be improved. Rheology defines how materials flow and react under the stress of printing process. Rheology takes into consideration two fundamental components: viscosity, which refers to the material's resistance to flow, and plasticity, which applies to its structure or "stickiness". The term "structure" in rheology, is a term that refers to the formation of stable physical bonds between particles or chemical bonds between macromolecules in a fluid. These bonds result in aggregate, floc, or network structure like in the case of a gel, which impacts the Theological behavior of the fluid and provides elastic and plastic properties.

In screen printing the ideal situation is for the material to have a high initial viscosity that drops quickly under the shear force of the squeegee during the print stroke. Materials that flow more readily when shear force is applied are considered psuedoplastic. The ideal material should recover a higher viscosity immediately after transferring to prevent flowout on the substrate and maintain image integrity.

The screen-printing operation at the end must deliver a repeatable results across the different parts and for the time required to process the needed quantities. The optimization of the process parameters and equipment setting is key to deliver a constant result out of the process.

Unfortunately the gel is a Non-Newtonian fluid (time dependent), that means that the viscosity of the fluid is dependent on temperature, shear rate and time with a thixotropic and shear thinning behaviors, or in other words the material flow or viscosity change with time and shear rate. The shear thinning terminology underlines that the viscosity of the material decreases with increased shear rate, while thixotropic indicates a time thinning behavior, i.e. viscosity decreases with time.

Thixotropy is a reversible time-dependent decrease in viscosity at a particular shear rate but shearing in gels causes a gradual breakdown in structure over time. This phenomenon (also known as rheomalaxis) is an irreversible decrease of viscosity during shearing due to permanent changes in the material structure.

There is a time-dependence that includes those effects associated with transient flow conditions as well as those effects associated with irreversible changes that result from shear history or aging of the material (Gel) under usage.

The result is that the gel due to its rheological properties can be used for a limited numbers of strokes by the squeegee before being replaced. The operation to replace the material requires: 1) to stop the machine and consequently the production, 2) to manually collect the material from the top surface of the stencil, 3) cleaning the top and bottom side of the stencil, 4) place the new material on top of the stencil, 5) run a dummy squeegee stroke to make the material rolling on the stencil surface to uniform its distribution, 6) restart production.

The rheological properties of the gel are driving a high level control of the process parameters due to the fact that a too fast movement of the squeegee will apply a too high level of shear strain that will determine an immediate breakdown of the gel that will liquefy as water spreading in an uncontrolled way on the processed production part.

Uncontrolled exposure of the gel (uncured) on the screen-printing machine will allow the material to absorb moisture from the environment and the increase of water weight in the gel will modify the Theological properties lowering the resistance to the shear stress making more critical the utilization of optimized process parameters. Also the paste disclosed in U.S. patent application Ser. No. 09/666,949 causes some problems because of the screening process that is known to be a complex operation, and requires the right interaction of several factors to be successful. Screen printing main factors can be listed as following: a) Stencil design. The stencil can be of metal or other materials, usually is made of a very thin brass or stainless steel foil, only 100 to 250 μm of thickness. The stencil presents a definite pattern of apertures made by etching or laser or other methodologies to make openings compatible with the stencil materials. The shape of the apertures and the size of the same are the result of an optimization study of the behavior of the material that need to be deposited by the screening operation. Different materials may require different openings to achieve the same pattern and deposit characteristics. The same shape of the vertical wall of the stencil opening are fundamental in the way the material will detach from it once the squeegee has pushed the material in the stencil openings. The main objective is to avoid the clog of the opening that will result in a missing deposit of material in the following operation/piece. There is a relation between the minimum size of the opening and the way the screened material detaches from the vertical walls of the stencil openings.

b) The screen printer equipment: in latest technology development with smaller and smaller features it requires a vision system for self alignments of the large stencil over the part to process. They are expensive micro controlled tools. They need to automatically control the 1) positioning of the stencil over the processing parts, 2) control the travel of the squeegee, 3) control the pressure of the squeegee over the stencil, 4) control the "snap-off" or distance between the stencil and the processed part when the squeegee is at rest at the end of the printing travel.

All the above need to be experimentally tested and defined to create a processing set of instructions to process a defined product.

It is an object of the present invention to provide a technique which alleviates the above drawbacks.

According to the present invention, we provide a water soluble protective paste for protecting metal circuits during the manufacture of electronic modules comprising a salt, a glycerol and a densifier dissolved in water.

Also, according to the present invention we provide a method of selectively dispensing the water soluble protective paste described above by means of offset printing.

Furthermore, according to the present invention we provide a method of protecting metal circuits and pads on the surface of an electronic board during manufacturing steps, comprising:— selectively dispensing over the metal circuits and pads the water soluble protective paste described above, by means of offset printing;— drying the dispensed layer obtaining a solid protective film.

BRIEF DESCRIPTION OF THE DRAWINGS

The above and other advantages of the present invention will be better understood with reference to the following figures, where.

BRIEF SUMMARY OF THE INVENTION

The paste and method according to a preferred embodiment of the present invention mitigates the problem of the protective paste of the prior art. An additional advantage of the paste according to the present invention is that the protective layer can be deposited also by means of an offset printing process, avoiding the use of the stencil and of the screening steps. Screening process is a labourious operation which requires very sophisticated equipment and a very high precision in the design of the stencil. Because of these requirements, screening is an expensive process. On the other hand offset printing is a very simple, cheap and reliable method. In addition, the film forming properties allow the material to create a protective film even with a thin deposited film.

The main concern addressed by the present protective method is to avoid gold or other noble surfaces contamination during the SMT assembly operations, achieving a high assembly process yield. This protection is realised by means of a protective layer which is water soluble and can be deposited on the metal circuits with an offset printing process. The main difference of the present protective paste from the prior art paste disclosed in the above mentioned patent application is the presence of a densifier which gives a higher viscosity to the material, allowing the use of the offset process instead of the screening operation. However the improved composition of the paste and its rehological properties provide some advantages also with the screening process used in the prior art for depositing the protective layer.

The process for the manufacturing a HMCM according to a preferred embodiment of the present invention has the following steps:— protective paste deposited on the gold pads;— protective paste drying;— solder paste deposition on SMT pads;— SMT component placement;— solder paste reflow; — chip adhesive dispensing on the chip site;— chip adhesive curing (i.e polymerisation)—package water washing and removing of the protective paste;— U.V. cleaning;— wire bonding.

The protective paste according to a preferred embodiment of the present invention contains a salt (e.g. Sodium or Potassium citrate), glycerine and a densifier (e.g. Gum Acacia, gum tracanth, gum karaya, guar gum). Even if different densifiers could be used, according to a preferred embodiment of the present invention a densifier belonging to the Hydrocolloids group has been preferred; the densifier quantity depends on its properties.

All components are from natural sources and environmentally friendly even after washing and removal from the electronic module laminates they do not pose environmental threat.

Hydrocolloids are specific natural compounds, they are soluble in cold water, they have emulsifier properties, film forming properties and adhesive properties.

Gum Arabic or gum Acacia is a polysaccaride and its composition is of major monosaccharides: D-galactose, D-glucuronic acid; anionic exudate polysaccharide of arabic acid, a highly branched polymer of Beta-D-glactose, L-arabinose, D-gluconic acid, L-rhamnose, 4-O-methyl-D-gk, A beta-D-gal, L-ara, D-glcA, L-rha, 4-O-methyl-D-gka, (D-glcA=D-glucuronic acid, D-galA=D-galacturonic acid, L-gulA=L-guluronic acid).

Gum tragacanth, which composition has the following major monosaccharides: D-galacturonic acid and D-galactose, L-fucose, D-xylose, L-arabinose; anionic exudate of tragacanthin and bassorin which are polymers: D-galacturonic acid, D-xylose, L-arabinose, D-fructose, D-arabinose, L-rhamonose hawthorne structure (D-glcA=D-gluronic acid; D-galA=D-galacturonic acid, L-gulA=L-guluronic acid)Gum Karaya, which composition is D-galacturonic acid, D-galactose, L-rhamnose, D-glucuronic acid hawthorne structure.

Guar Gum, which composition has major monosaccharides: D-mannose, D-galactose; non-ionic seed polysaccharide: made up of straight chain mannan grouping with relatively regular branching on every second mannose by a single galactose unit: beta-D-man, alpha-d-gal (D-glcA=D-gluronic acid; D-galA=D-galacturonic acid, L-gulA=L-guluronic acid).

DETAILED DESCRIPTION OF THE INVENTION

In a preferred embodiment the quantity of the salt is between 8% to 30% of the glycerol in weight, while the densifier is in the range between 7% to 25% (e.g. 20%) in weight of the citrate salt. These three components are all water soluble and they are dissolved in water and mixed together. According to a preferred embodiment of the present invention, the components are mixed in a vacuum chamber until the water evaporates.

According to a preferred embodiment of the present invention the paste has been prepared in the following way: 2.5 g of a salt (e.g. Sodium citrate), 0.5 g of a Hydrocolloid (e.g. gum acacia) and 10 g of glycerol are dissolved in DI water (a quantity enough to dissolved the three components above). Then the solution is mixed in a vacuum chamber at 50° C. minimum until the water weight is lost. Vacuum mixing increases the water evaporation rate at lower temperature and avoid the trapping of air bubbles within the gel formation during the mixing operation.

According to a preferred embodiment of the present invention, the protective paste is then deposited on the metal (e.g. Gold) surface to be protected, then dried until all the glycerol completely evaporates thus obtaining a solid film which can bear thermal cycles such as reflow temperatures for tin-lead soldering operations, mechanical abrasion and attrition and product handling. At the end of the manufacturing process the film is removed by washing away at 60° C. During the washing, a desirable side effect is given by the adhesion properties of the densifier, which cause the removal of unwanted particles (e.g. dust or fibers) from the metal surface.

Figure 3A:
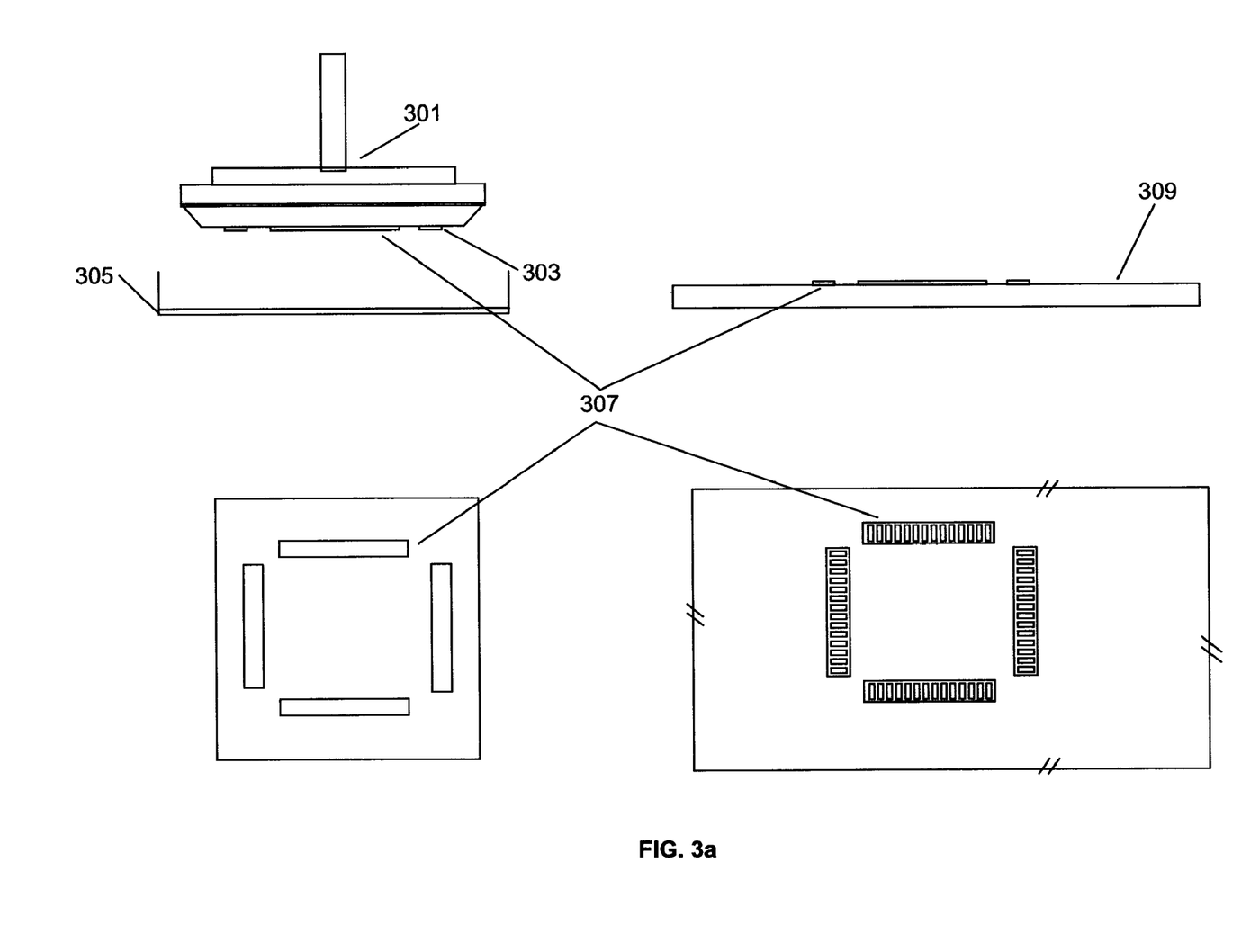
FIGS. 3*a*–3*d* is a schematic representation of the offset printing process for dispensing the protective layer according to a preferred embodiment of the present invention.
Figure 3B:
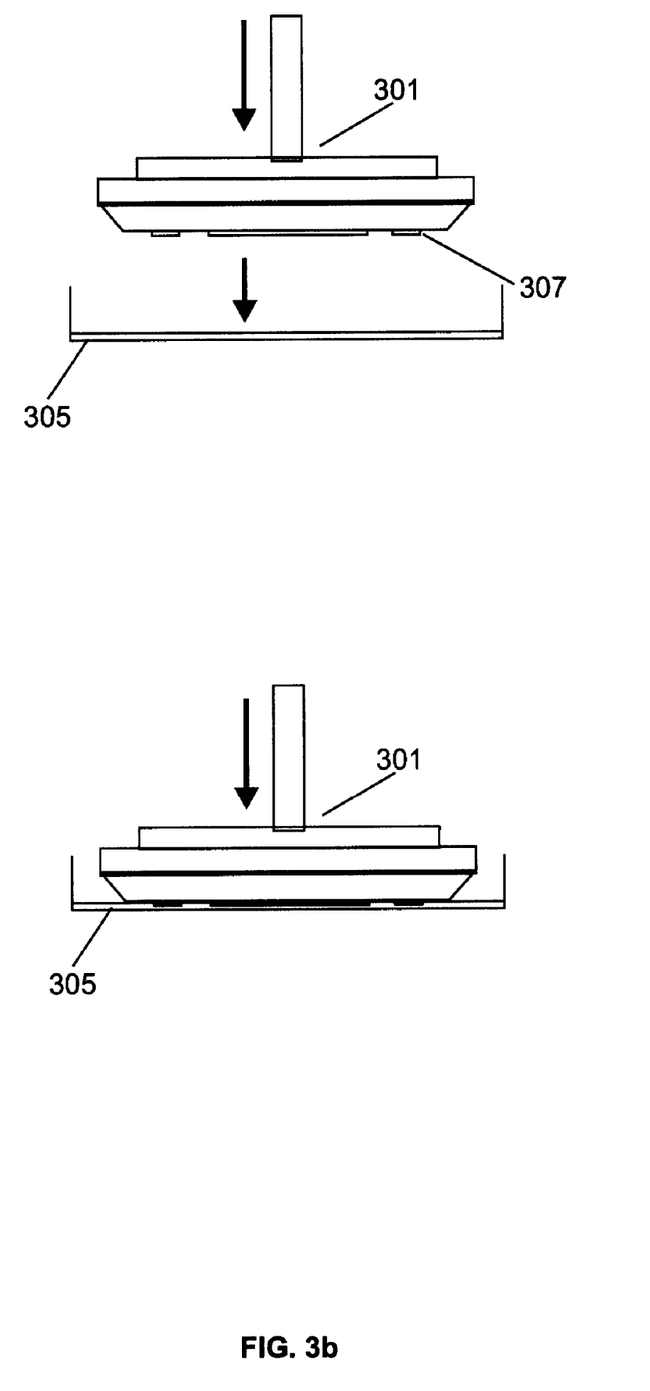
Figure 3C:
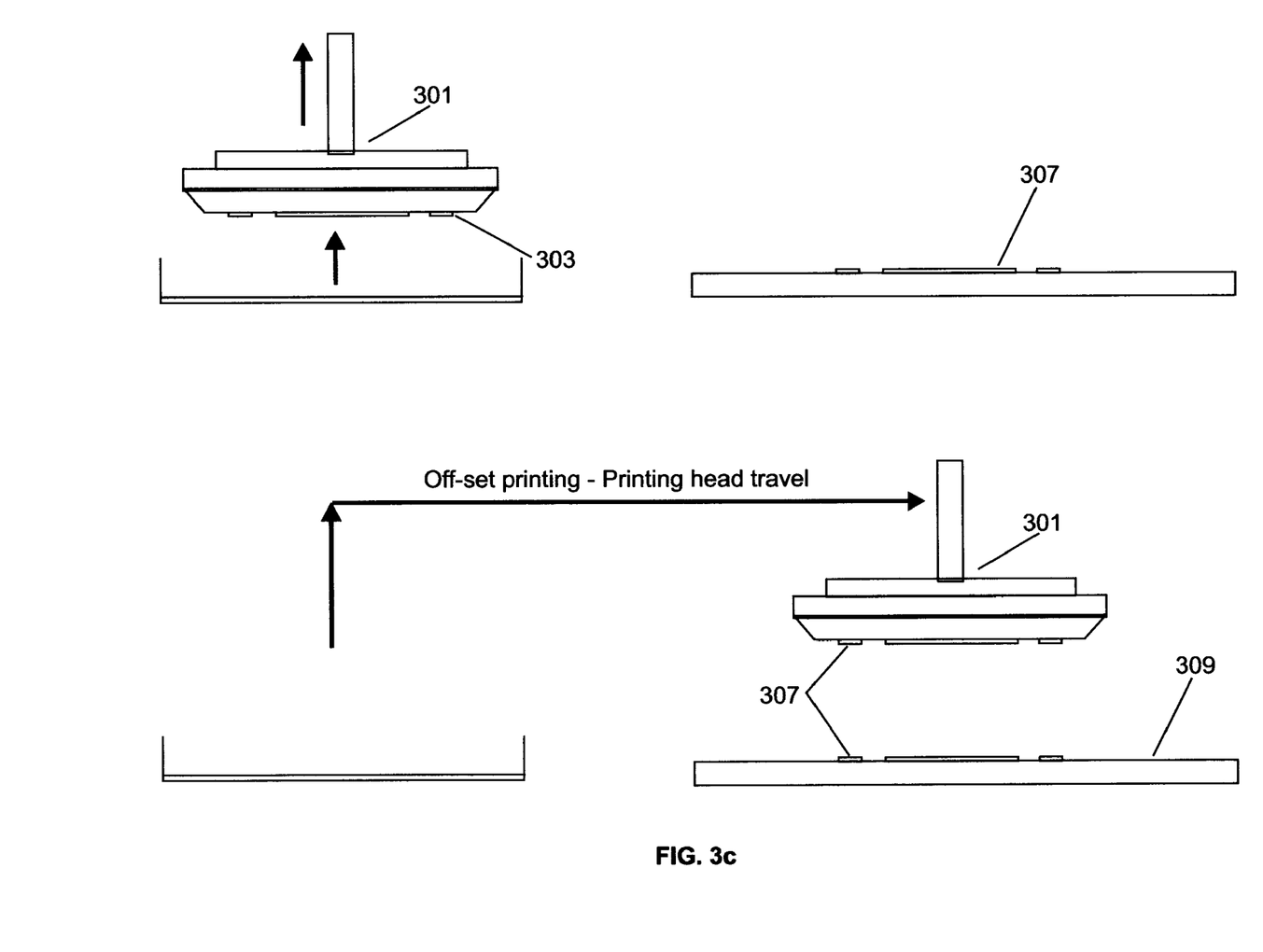
Figure 3D:
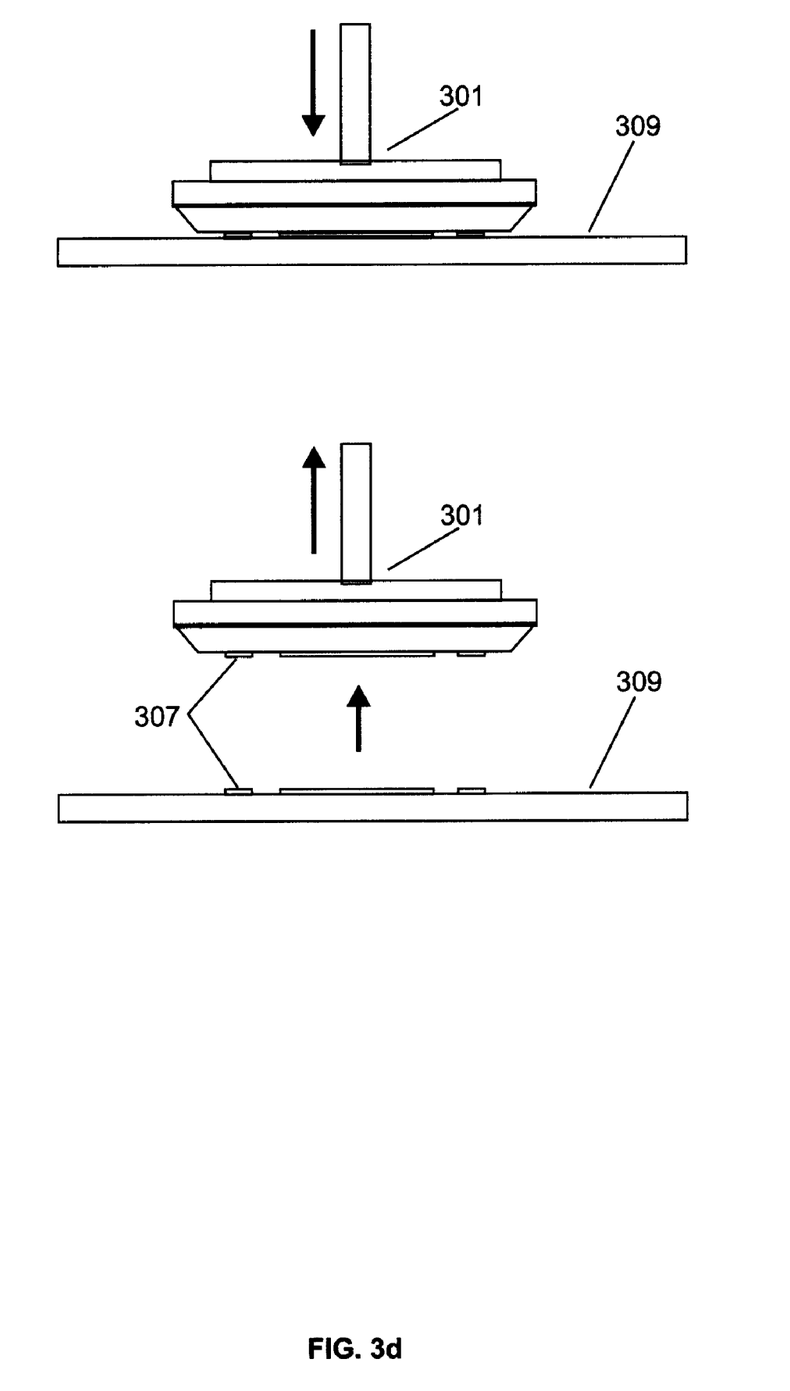

The high viscosity of the paste, obtained with the above described process, allows the protective layer to be deposited by means of an offset printing process. As shown in FIG. 3a, this step is performed by means of a printing head 301 having a rubber head pad surface 303, which is designed according to the shape (307) of the circuit or the surface to be protected during the phases of the card manufacturing. The gel paste is placed into a reservoir 305 that keeps the gel at a uniform thickness (e.g. 0.1 mm). As shown in FIG. 3b, the rubber print head 301 is immersed into the gel which, due to the adhesion properties, attaches on the shape 307 of the rubber head pad surface, then the head is positioned over the surface 309 to be protected and it is placed in contact with it (FIG. 3c). Again, due to the viscosity of the gel the top surface of the laminate gets covered by the gel, the rubber head is retracted (FIG. 3d) and the material cohesively separate leaving on the board a uniform protective layer on the surface. By the material (gel) properties of film forming and viscosity the material do not show flow but relaxes to a uniform layer covering the area of interest.

At this point the deposited material undergoes a drying operation at temperature above 150° with consequent loss of volume due to the loss of the volatile glycerine in the deposit leaving a uniform coating layer on the surface of the carrier. In a preferred embodiment an in-line oven with Nitrogen atmosphere and less than 200 ppm of Oxygen is used. According to a preferred embodiment, the drying cycle ramps up from room temperature to about 150° C. with increment of about 2° C./second, maintaining a temperature plateau of 150° C. for about 8 minutes. The protective film does not require any specific oven rampdown temperature profile, so that this can be adapted to the requirements of the base materials for electronic circuits. The material when fully dried is in the form of a smooth, thin layer. The above oven settings are believed to be the optimal values, but different settings (e.g. standard reflw profiles for soldering pastes that reaches temperatures of more than 220° C.) could be used instead with satisfactory results and without affecting protective materials properties.

After the manufacturing process is completed, as detailed above, the protective material must be removed. This can be easily done with a washing operation using demineralized water at a temperature of 60° C. According to a preferred embodiment the washing operation could be performed in an in-line washer with multiple tanks, which is a standard equipment in manufacturing operations where soldering steps are planned. As demonstrated by ESCA analysis, no residues are left on the board by the protective film described above after removal. Also wire bonding trials reported very good values for wire bond pull tests.

What is claimed is:

1. A method of making a water soluble protective paste for protecting metal circuits during the manufacture of electronic modules, comprising: mixing a salt, a glycerol and a densifier dissolved in water in a vacuum chamber, the salt being 5% to 110% of the glycerol by weight and the densifier being 5% to 90% of the salt by weight, at a temperature of at least 50° C.

2. The water soluble protective paste of claim 1 wherein the salt is 5% to 110% of the glycerol in weight and the densifier is 5% to 90% of the salt in weight.

3. The method of claim 2 wherein the salt is 8% to 30% of the glycerol in weight and the densifier is 7% to 25% of the salt in weight.

4. The method of claim 1 wherein the salt is Sodium citrate.

5. The method of claim 1, wherein the salt is Potassium citrate.

6. The method of claim 1 wherein the salt is about 25% of the glycerol in weight.

7. The method of claim 6 wherein the densifier is about 20% of the salt in weight.

8. The method of claim 1 wherein the densifier is a Hydrocolloid.

9. The method claim 8 wherein the Hydrocolloid is Gum Acacia.

10. A method of selectively dispensing the water soluble protective paste of claim 1 by means of offset printing.

11. A method of protecting metal circuits and pads on the surface of an electronic board during manufacturing steps, comprising:
    selectively dispensing over the metal circuits and pads the water soluble protective paste of claim 1, by means of offset printing;
    drying the dispensed layer obtaining a solid protective film.

12. A method for manufacturing a multi chip module having on the same substrate at least one wire banded chip and at least one Surface Mount Technology (SMT) chip, the method comprising the steps of:
    protecting, with the method of claim 11, the metal circuits and pads to which the wire bonded chip will be connected;
    mounting the at least one SMT chip;
    removing the protective layer from the metal circuits and pads;
    attaching and bonding the at least one wire bonded chip.

13. A method of making a water soluble protective paste for protecting metal circuits, comprising: mixing a salt, a glycerol and a densifier dissolved in water in a vacuum chamber, the salt being about 25% of the glycerol by weight, at a temperature of not less than 50° C.

14. The method of claim 13 wherein the salt is 5% to 110% of the glycerol in weight and the densifier is 5% to 90% of the salt in weight.

15. The method of claim 14 wherein the salt is 8% to 30% of the glycerol in weight and the densifier is 7% to 25% of the salt in weight.

16. The method of claim 13 wherein the salt is Sodium citrate.

17. The method of claim 13, wherein the salt is Potassium citrate.

18. The method of claim 13 wherein the densifier is about 20% of the salt in weight.

19. The method of claim 13 wherein the densifier is a Hydrocolloid.

20. The method of claim 19 wherein the Hydrocolloid is Gum Acacia.

21. A method of selectively dispensing the water soluble protective paste of claim 13 by means of offset printing.

22. A method of protecting metal circuits and pads on the surface of an electronic board, comprising:
    selectively dispensing over the metal circuits and pads the water soluble protective paste of claim 13, by means of offset printing;
    drying the dispensed layer obtaining a solid protective film.

23. A method for manufacturing a multi chip module having on the same substrate at least one wire bonded chip and at least one Surface Mount Technology (SMT) chip, the method comprising the steps of:
    protecting, with the method of claim 22, the metal circuits and pads to which the wire bonded chip will be connected;
    mounting the at least one SMT chip;
    removing the protective layer from the metal circuits and pads;
    attaching and bonding the at least one wire bonded chip.

* * * * *